(12) United States Patent
Pivnichny et al.

(10) Patent No.: US 6,194,905 B1
(45) Date of Patent: Feb. 27, 2001

(54) METHOD FOR TESTING INTEGRATED CIRCUIT COMPONENTS OF A MULTI-COMPONENT CARD

(75) Inventors: John R. Pivnichny, Vestal; Joseph H. Underwood, Apalachin, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/516,354

(22) Filed: Mar. 1, 2000

Related U.S. Application Data

(62) Division of application No. 09/035,167, filed on Mar. 5, 1998, now Pat. No. 6,107,812.

(51) Int. Cl.$^7$ .................................................. G01R 31/02
(52) U.S. Cl. ........................................... 324/757; 324/754
(58) Field of Search .................................. 324/754, 757, 324/158.1

(56) References Cited

U.S. PATENT DOCUMENTS

| | | | |
|---|---|---|---|
| 5,313,097 | 5/1994 | Ahmadi et al. | 257/706 |
| 5,339,027 | * 8/1994 | Woith et al. | 324/754 |
| 5,420,520 | 5/1995 | Anschel et al. | 324/754 |
| 5,428,298 | 6/1995 | Ko | 324/762 |
| 5,523,696 | 6/1996 | Charlton et al. | 324/758 |
| 5,528,159 | 6/1996 | Charlton et al. | 324/758 |
| 5,656,941 | * 8/1997 | Bishop et al. | 324/754 |
| 5,680,057 | * 10/1997 | Johnson | 324/757 |

* cited by examiner

*Primary Examiner*—Glenn W. Brown
(74) *Attorney, Agent, or Firm*—Heslin & Rothenberg, P.C.

(57) ABSTRACT

An apparatus/method is provided for temporarily electrically contacting leads of an integrated circuit component on a multi-component board under test. A flexible circuit member having a plurality of contacts is used to connect to respective leads of the circuit component. A clamp mechanism imparts a clamping force to the flexible circuit member to clamp the flexible circuit member against the leads of the integrated circuit component, thereby ensuring that the plurality of contacts are in electrical contact with their respective leads. A resilient member is disposed between the flexible circuit member and the clamp mechanism for distributing and partially absorbing the clamping force imparted by the clamp mechanism in order to account for imperfections in and tolerances of the surface mount leads of the integrated circuit component. The plurality of contacts include dendritic surfaces to enhance electrical connection thereof to the respective leads of the integrated circuit component.

6 Claims, 2 Drawing Sheets

METHOD FOR TESTING INTEGRATED CIRCUIT COMPONENTS OF A MULTI-COMPONENT CARD

CROSS-REFERENCE TO RELATED APPLICATION

This application comprises a divisional patent application from commonly assigned, patent application Ser. No. 09/035,167, filed Mar. 5, 1998, now U.S. Pat. No. 6,107,812, which is hereby incorporated herein by reference in its entirety.

TECHNICAL FIELD

This invention relates to integrated circuit testing, and more particularly, to an apparatus and method for testing semiconductor chips and other integrated circuit components permanently attached to a multi-component carrier, printed circuit card or the like.

BACKGROUND OF THE INVENTION

In the population of integrated circuit chip carriers, including thermally conductive modules, ceramic substrates, and polymeric substrates, it is necessary to minimize the shipment of modules with defective integrated circuit chips or other components. Integrated circuit chips in particular are subjected to various wafer level tests during various stages of fabrication, typically prior to dicing. After dicing, it is difficult and expensive to test these integrated circuit chips. One reason for this is that the integrated circuit chip must be tested through its pins and contacts or pads before populating of the carrier, card, board or the like.

Typically, integrated circuit chips are attached to a chip carrier, thermally conductive module chip carrier, circuit card or board, e.g., by solder bonding, brazing, controlled collapse chip connect, wire lead bonding, metal bump bonding, tape automated bonding, or the like. The chip is then tested as part of an assembly and when a fault is found, the chip is removed from the card or board.

When debugging cards containing circuit packages with many surface mount leads, it is difficult to apply and hold a test clip to the leads while ensuring that a reliable connection is made to the leads. Significant time can be wasted reapplying a test clip that has partially or completely slipped off the surface mount leads, whether by a slight bump or tug on the test clip wires or possibly because friction/clamping engagement to the leads failed due to imperfections in the leads. If the test clip becomes disconnected, a long test sequence might have to be restarted. Further, an undetected poor or open contact can cause a false signal level at a metering device leading to a false conclusion about the integrated circuit component or the card itself. For example, oxidation of a surface mount lead or its solder connection to the card can inhibit/prevent electrical connection of the test clip to the lead, thereby potentially resulting in a defective test result.

Thus, an enhanced method/apparatus is needed in the art for a means for rapid, reproducible, electrical connection of a test clip to the leads of an integrated circuit component mounted on a multi-component card for high throughput testing of the integrated circuit components of the card.

DISCLOSURE OF THE INVENTION

Briefly summarized, this invention comprises in one aspect apparatus for temporarily electrically contacting leads of an integrated circuit component to be monitored. The apparatus includes a test clip having a plurality of contacts for connecting to the leads of the integrated circuit component. Each contact has a contact surface which electrically connects to a respective lead of the integrated circuit component when the test clip is placed in engagement with the integrated circuit component. Dendrites are disposed on the contact surfaces to ensure electrical connection between each electrical contact and its respective surface mount lead. Preferably, the plurality of contacts are disposed on a flexible circuit comprising a sheet of pliable insulator material, and a clamp mechanism is provided for ensuring physical connection of the contact surfaces to the corresponding leads of the integrated circuit component.

In another aspect, this invention comprises apparatus for temporarily electrically contacting the leads of an integrated circuit component under test. The integrated circuit component is again attached to a component carrier, printed circuit card or the like. This apparatus includes a flexible circuit member and a clamp mechanism. The flexible circuit member has a plurality of electrical contacts which are arranged to align to respective leads of the integrated circuit component when the flexible circuit member is placed in engagement therewith. The flexible circuit member is fabricated of a pliable insulator material and has a metallic layer disposed thereon. The plurality of electrical contacts comprise a portion of the metallic layer. The clamp mechanism imparts a clamping force to the flexible circuit member to clamp the flexible circuit member against the leads of the integrated circuit component, thereby ensuring electrical connection of the plurality of electrical contacts to their respective leads of the integrated circuit component. Preferably, a resilient layer is disposed between the flexible circuit member and the clamp mechanism for distributing and partially absorbing the clamping force imparted by the clamp mechanism to account for imperfections in and tolerances of the surface mount leads of the integrated circuit component.

In still another aspect, a method is provided for temporarily electrically contacting leads of an integrated circuit component under test. The method includes: providing a flexible circuit member having a plurality of electrical contacts disposed thereon, the plurality of electrical contacts being arranged to align to respective leads of the integrated circuit component when the flexible circuit member is placed in engagement therewith, the flexible circuit member being manufactured of a pliable insulator material and having a metallic layer disposed thereon, the plurality of electrical contacts comprising part of the metallic layer; placing the flexible circuit member adjacent to the leads of the integrated circuit component with the plurality of electrical contacts aligning to respective leads of the integrated circuit component; and clamping the flexible circuit member against the leads of the integrated circuit component thereby ensuring electrical connection of each electrical contact of the plurality of electrical contacts to its respective lead of the integrated circuit component.

In all aspects, this invention presents an enhanced approach for ensuring good electrical connection of a test clip to a semiconductor chip or other integrated circuit component permanently attached to a multi-component carrier, printed circuit card or the like. Advantageously, the flexible circuit disclosed prevents individual contacts from moving horizontally out of alignment with the leads of the integrated circuit component, yet still flexes to allow for manufacturing tolerances or imperfections in the surface mount leads themselves, thereby allowing each contact to better align to its corresponding component lead.

Electrical contact is further enhanced by positioning a resilient material between the flexible circuit sheet and a clamping mechanism, which imparts a clamping force to the flexible circuit. The resilient material takes up any irregularities in the individual leads, while the clamping mechanism ensures electrical connection of all electrical contacts to the respective surface mount leads. Apparatus in accordance with this invention further provides a more positive contact to the device under test through the use of dendrites on the respective contact surfaces. These dendrites operate to inhibit contact slippage and enhance electrical connection to the leads by, e.g., connecting more effectively through any oxide layer on the leads.

BRIEF DESCRIPTION OF THE DRAWINGS

The above-described objects, advantages and features of the present invention, as well as others, will be more readily understood from the following detailed description of certain preferred embodiments of the invention, when considered in conjunction with the accompanying drawings in which.

BEST MODE FOR CARRYING OUT THE INVENTION

Generally stated, a test clip in accordance with the principles of the present invention is used to electrically contact surface mount leads of an integrated circuit component secured to a multi-component carrier, printed circuit card, or the like for monitoring signals in a multi-component function to analyze, debug, or verify the multi-component design of the card. A test clip in accordance with the principles of the present invention employs various novel features to enhance electrical contact of the test clip to respective surface mount leads of the component to be monitored. These features will be apparent from the following discussion of FIGS. 1–3a.

Figure 1:
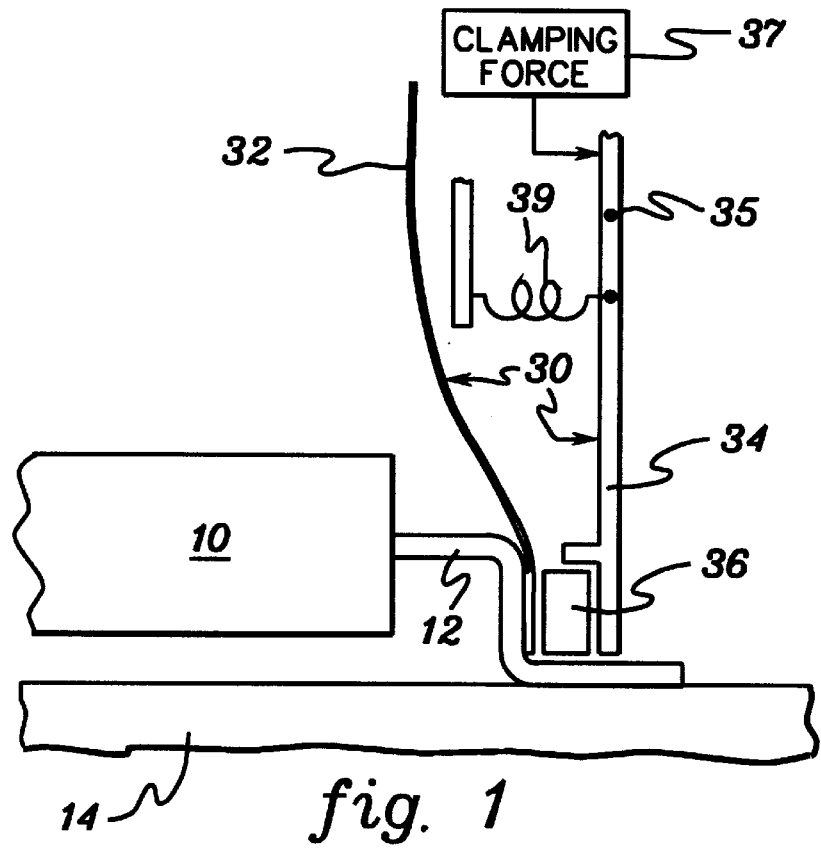
FIG. 1 depicts one embodiment of a test clip in accordance with the principles of the present invention, wherein a flexible circuit member 32 having multiple contacts electrically contacts the surface mount leads 12 extending from one side of an integrated circuit component 10 mounted to a card 14.
Figure 2:
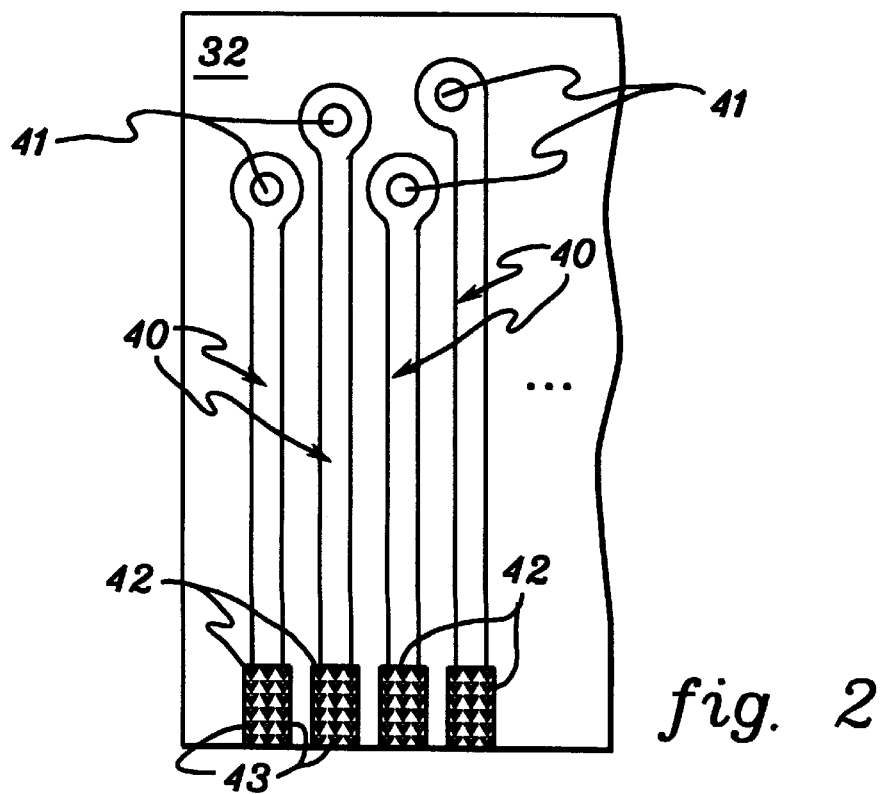
FIG. 2 is an elevational view of one embodiment of the flexible circuit member 32 of FIG. 1 wherein a plurality of contact surfaces 42 are shown with dendrites 43 for enhanced electrical connection of the contacts 40 to the respective leads of the component under test.

FIGS. 1 & 2 depict one embodiment of a test clip, generally denoted 30, in accordance with the present invention. Test clip 30 includes a flexible circuit member 32 having a plurality of contacts 40 arranged in a conductive pattern. The plurality of contacts 40 include a plurality of contact surfaces 42 having dendrites 43 disposed thereon. Conductors 40 may be manufactured of any metallic material, such as copper, and have an overlying passivation layer to minimize oxidation in a manner well known in the art of flex circuit construction. The plurality of contacts 40 further include an array of connections 41 for electrically connecting contacts 40 to a selected metering device(s) (not shown).

Flex circuit member 32 can be fabricated of a pliable insulator material, such as a polyimide. Fabrication of dendrites is described in commonly assigned U.S. Pat. Nos. 5,420,520 and 5,313,097, which are both hereby incorporated herein by reference in their entirety. As described in U.S. Pat. No. 5,420,520, connectors having dendrites characterized by elongated, cylindrical morphology can be prepared by a high frequency, high voltage, high current density, pulse plating methodology utilizing a dilute electrolyte. For example, the pulsed electrodeposition of palladium can be accomplished from a 10–150 millimolar Pd tetramine chloride, 5 molar ammonium chloride solution with a 50 to 450 Hz and 200 to 1100 milliamperes per square centimeter pulse plating technique. Electrodeposition of Pd dendrites is further described in U.S. Pat. Nos. 5,137,461 & 4,328,286.

In addition to flexible circuit member 32, test clip 30 of FIGS. 1 & 2 includes a clamping mechanism 34 for applying a clamping force 37 to the end of the flexible circuit member having contact surfaces 42. Preferably, this clamping force 37 is applied to circuit member 32 across a resilient member 36. As noted above, due to its pliability, flex member 32 better aligns to the individual leads 12 of the integrated circuit component 10 disposed on card 14 when the member is positioned adjacent to the leads. Placing resilient member 32 between clamp mechanism 34 and flexible member 32 further distributes the clamping force and accommodates any irregularities in the individual surface mount leads 12. Essentially, resilient member 36 allows the clamping force to conform to the surface mount leads thereby providing enhanced electrical connection between the plurality of contacts 40 and leads 12.

In the embodiment of FIG. 1, clamp mechanism 34 includes a spring force 39 for biasing mechanism 34 in a retracted position to allow ready positioning and removal of flexible circuit member 32 from engagement with the surface mount leads 12 of the integrated circuit component. When in use, clamping force 37 is designed to readily overcome the biasing force of spring 39. A fulcrum or pivot point 35 might be disposed between the clamping force 37 and biasing spring 39. FIG. 1 is presented merely by way of example. Clamping force 37 and biasing spring 39 can comprise any clamp/bias mechanism understood by those skilled in the art for compressing and retracting a member.

Again, the clamp mechanism and resilient material are preferably in a retracted position initially to allow test clip 30 to be readily positioned with the flexible circuit member adjacent to the surface mount leads on one side of the integrated circuit component 10. After the flex circuit 32 is properly positioned, clamping force 37 is applied (through the resilient member) to the flex circuit to ensure electrical contact of the plurality of contacts 40 to their respective leads 12 of component 10. Once monitoring of component signals is complete, the clamp force is released and spring bias 39 retracts the clamp mechanism 34 thereby allowing withdrawal of the test clip 30 from the integrated circuit component.

In alternate embodiments, test clip 30 can be configured with two flex circuits, for example, to contact a dual-sided component, or four flex circuits to contact a quad-sided component. Configuration of the clamping force and spring bias for two flex circuits or four flex circuits can be readily accomplished by one skilled in the art based upon the description provided herein.

Figure 3:
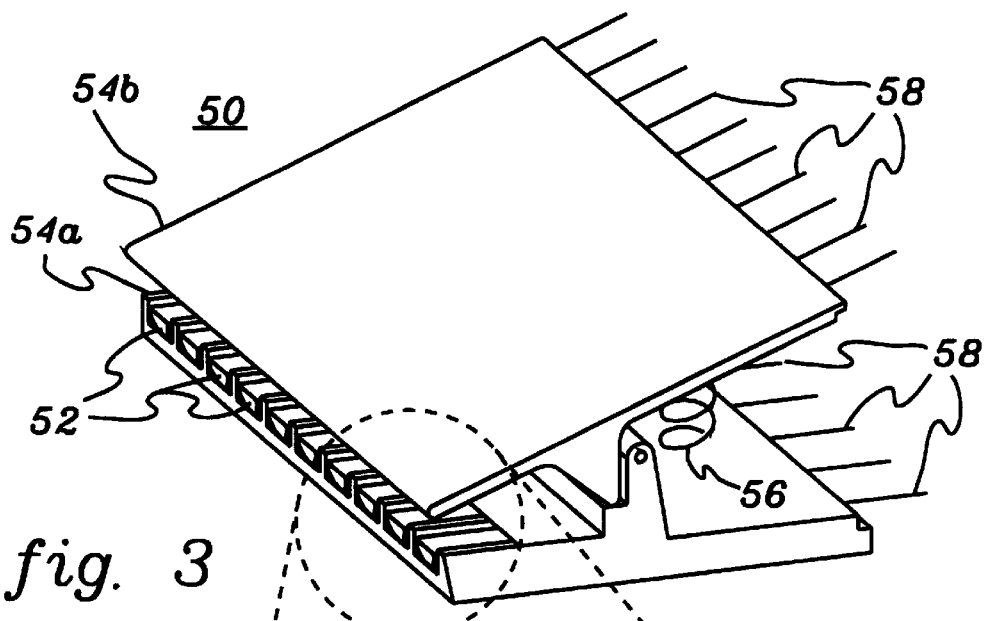
FIG. 3 is a perspective view of an alternate embodiment of a test clip 50 in accordance with the principles of the present invention.
Figure 3A:
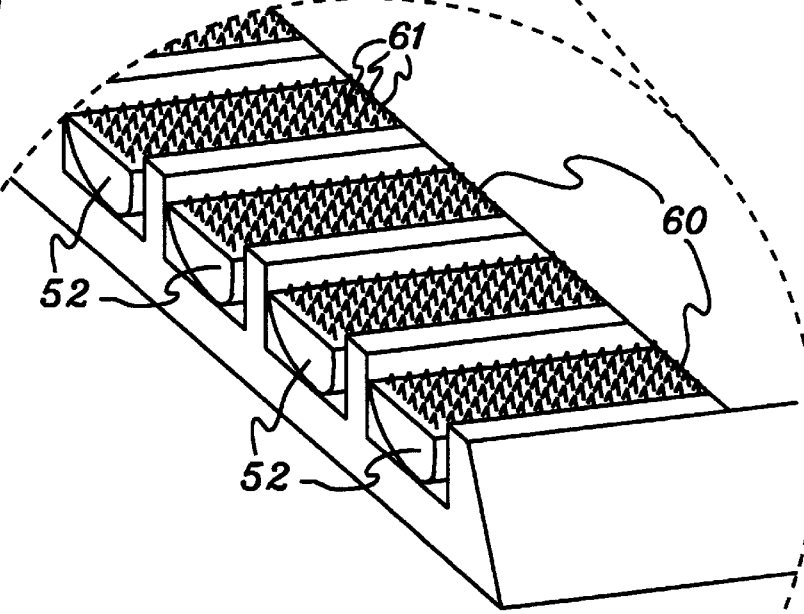
FIG. 3a is an expanded view of the encircled portion of the test clip 50 of FIG. 3.

FIGS. 3 & 3a depict an alternate embodiment of a test clip, denoted 50, in accordance with the principles of the present invention. This alternate embodiment is designed for electrically contacting a two-sided integrated circuit component, such as a dual inline package (a.k.a. "DIP"). However, those skilled in the art will recognize that the concepts presented in FIGS. 3 & 3a could be extrapolated to a four-sided integrated circuit component as well.

Clip 50 includes a plurality of contacts 52 on each side 54a, 54b thereof. Sides 54a & 54b of test clip 50 are rigid and are hingedly connected and spring biased 56 so that the plurality of contacts 52 on each side 54a & 54b will forcibly engage respective surface mount leads (not shown) on opposite sides of a two-sided integrated circuit component (not shown). Pins 58 extend from an edge of test clip 50 for connecting selected monitoring equipment to the clip.

In the expanded view of contacts 52 shown in FIG. 3a, each contact 52 is shown to have a contact surface 60 which is preferably shaped and sized to optimally engage a respective surface mount lead extending from the particular component to be electrically contacted. Further, each contact surface 60 has dendrites 61 for enhancing electrical contact to the respective surface mount lead as described hereinabove in connection with the apparatus of FIGS. 1 & 2.

Those skilled in the art will note from the above description that a technique has been provided to reliably contact a test clip to multiple pins of a surface mount component for connecting signals at the leads of the component to an oscilloscope, logical analyzer, or other piece of test equipment for monitoring the component once soldered to a multi-component board. Advantageously, the flexible circuit disclosed prevents individual contacts from moving horizontally out of alignment with respect to each other and with respect to the leads of the integrated circuit component, yet still flexes to allow for differences due to manufacturing tolerances or imperfections in the surface mount leads themselves, thereby allowing each contact to better align to its corresponding component lead. Electrical contact is further enhanced by positioning a resilient material between the flexible circuit sheet and a clamping mechanism to take up any irregularities in the individual leads. The inventive apparatus also provides a more positive contact to the device under test through the use of dendrites on the respective contact surfaces. The dendrites operate to inhibit contact slippage and enhance electrical connection to the leads, e.g., by contacting the leads more effectively through any oxide layer on the leads.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method for temporarily electrically contacting leads of an integrated circuit component to be monitored, said method comprising:

providing at least one flexible circuit member having a plurality of electrical contacts disposed thereon, said plurality of electrical contacts being arranged to align with respective leads of the integrated circuit component when said at least one flexible circuit member is placed in engagement therewith, said integrated circuit component being attached to a component carrier, and wherein each electrical contact of said plurality of electrical contacts has a contact surface configured for electrical connection to a respective lead of the integrated circuit component when the at least one flexible circuit member is placed in engagement with the leads of the integrated circuit component, and includes dendrites on each contact surface of the plurality of electrical contacts, said dendrites being configured to prevent slippage between the plurality of electrical contacts and the respective leads when the at least one flexible circuit member is placed in engagement with the leads of the integrated circuit component;

placing said at least one flexible circuit member adjacent to the leads of the integrated circuit component attached to the component carrier, with the plurality of electrical contacts aligning with respective leads of the integrated circuit component; and clamping said at least one flexible circuit member against said respective leads of the integrated circuit component, wherein said dendrites on each contact surface of said plurality of electrical contacts prevent slippage between said plurality of electrical contacts and the respective leads of the integrated circuit component.

2. The method of claim 1, further comprising prior to said clamping, disposing a resilient member between said at least one flexible circuit member and a clamping mechanism imparting said clamping of said at least one flexible circuit member to said respective leads of the integrated circuit component.

3. The method of claim 1, wherein said providing comprises providing each said flexible circuit member to comprise a pliable insulator material having a metallic layer disposed thereon, wherein said plurality of electrical contacts having said dendrites comprise part of said metallic layer.

4. The method of claim 3, wherein said providing comprises for each said flexible circuit member providing each said metallic layer to comprise an etched copper pattern on said pliable insulator material.

5. The method of claim 1, wherein said integrated circuit component comprises a dual-sided integrated circuit component and wherein said providing comprises providing multiple flexible circuit members each having a plurality of electrical contacts disposed thereon arranged to align with respective leads on one side of the integrated circuit component, wherein each contact of the plurality of electrical contacts has a contact surface configured for electrical connection to a respective lead of the integrated circuit component when the respective flexible circuit member is placed in engagement with the leads of the integrated circuit component, and contains dendrites configured to prevent slippage between the plurality of electrical contacts and the leads of the integrated circuit component.

6. The method of claim 1, wherein said integrated circuit component comprises a quad-sided integrated circuit component and wherein said providing comprises providing multiple flexible circuit members each having a plurality of electrical contacts disposed thereon arranged to align with respective leads on one side of the integrated circuit component, wherein each contact of the plurality of electrical contacts has a contact surface configured for electrical connection to a respective lead of the integrated circuit component when the respective flexible circuit member is placed in engagement with the leads of the integrated circuit component, and contains dendrites configured to prevent slippage between the plurality of electrical contacts and the leads of the integrated circuit component.

* * * * *